United States Patent
Nishimura

(10) Patent No.: US 7,259,361 B2
(45) Date of Patent: Aug. 21, 2007

(54) PRODUCING METHOD FOR SOLID-STATE IMAGE PICKUP DEVICE INCLUDING FORMATION OF A CARRIER ACCUMULATING REGION

(75) Inventor: Shigeru Nishimura, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/368,511

(22) Filed: Mar. 7, 2006

(65) Prior Publication Data

US 2006/0208159 A1   Sep. 21, 2006

(30) Foreign Application Priority Data

Mar. 18, 2005  (JP) ............... 2005-080345

(51) Int. Cl.
*H01L 27/00*  (2006.01)
(52) U.S. Cl. ............... 250/208.1; 250/214 R
(58) Field of Classification Search ........ 250/208.1, 250/214 R, 214 LA, 214 LS; 257/291, 296, 257/440; 348/308, 311, 303, 294, 297
See application file for complete search history.

(56) References Cited

U.S. PATENT DOCUMENTS 4,977,312 A * 12/1990  Juen ............... 250/208.1

* cited by examiner

*Primary Examiner*—Que T Le
(74) *Attorney, Agent, or Firm*—Fitzpatrick, Cella, Harper & Scinto

(57) ABSTRACT

The invention is to simplify a producing process for a solid-state image pickup device having pixels including MOS transistors, thereby improving productivity of the image pickup device. In a producing method for a solid-state image pickup device including pixels 100 each including a photoelectric conversion region 101 for generating photoelectrically a carrier and accumulating the carrier photoelectrically generated, a carrier accumulating portion 102 for accumulating a carrier overflowing from the photoelectric conversion region 101 in a period of carrier generation and accumulation thereof, and a MOS transistor Tx-MOS for transferring the carrier overflowing from the photoelectric conversion region 101, wherein a gate electrode of the MOS transistor Tx-MOS is formed in the same step as the step of forming a polysilicon film 118 constituting the first electroconductive film of the carrier accumulating portion 102.

5 Claims, 14 Drawing Sheets

<RELATION BETWEEN LIGHT QUANTITY INCIDENT IN PHOTOELECTRIC CONVERTING UNIT 101 AND SIGNAL CARRIER GENERATED THEREIN>

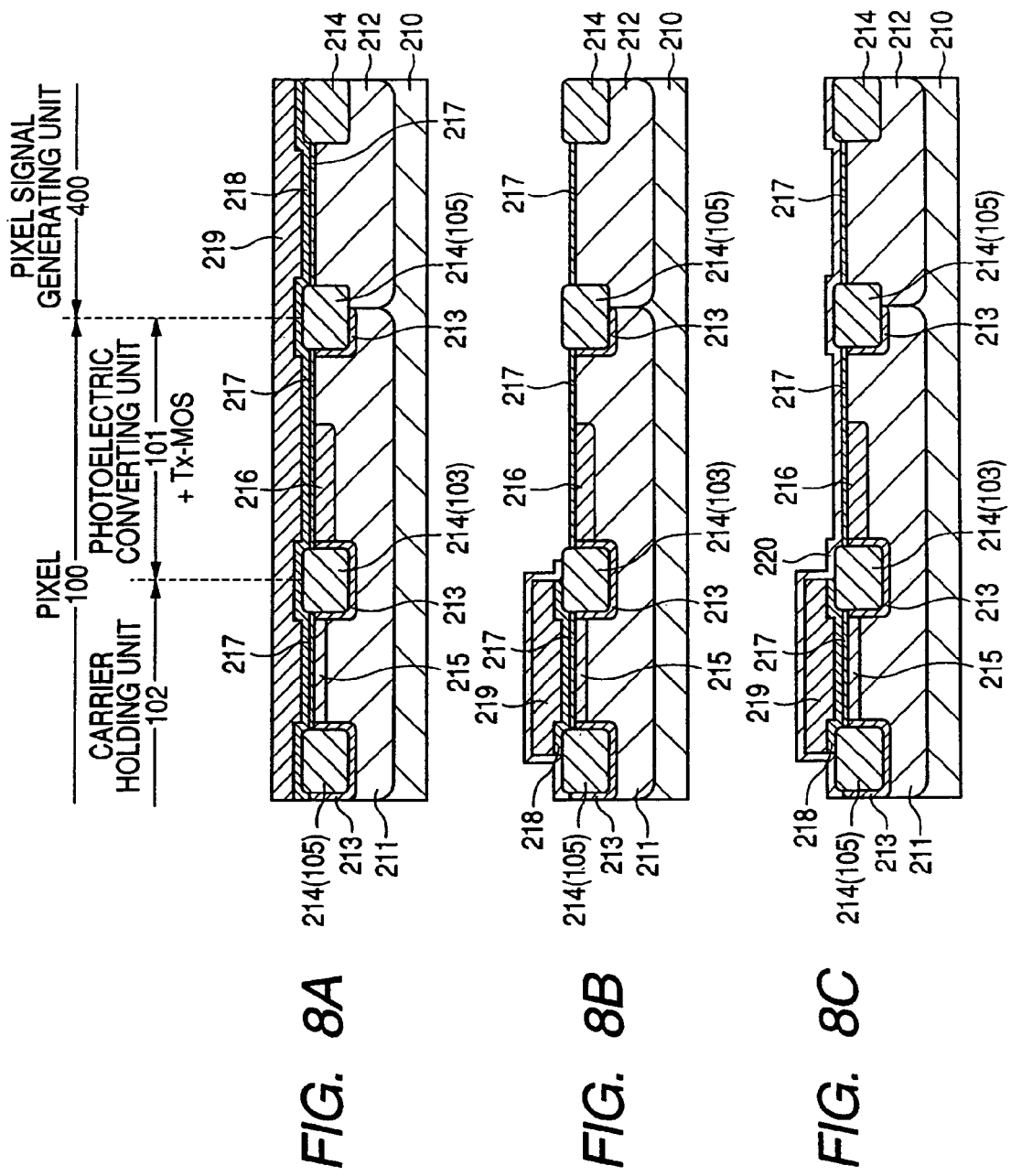

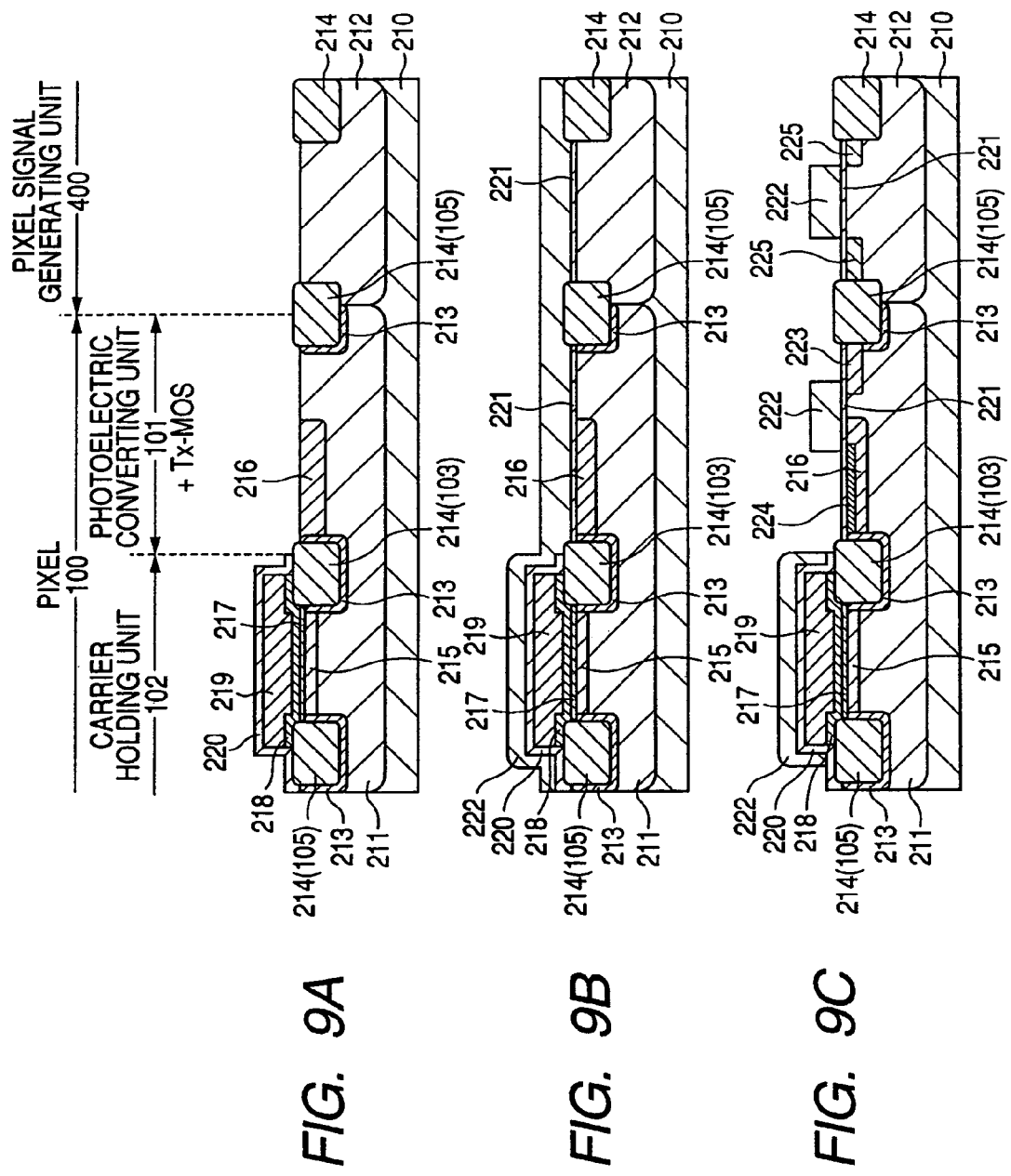

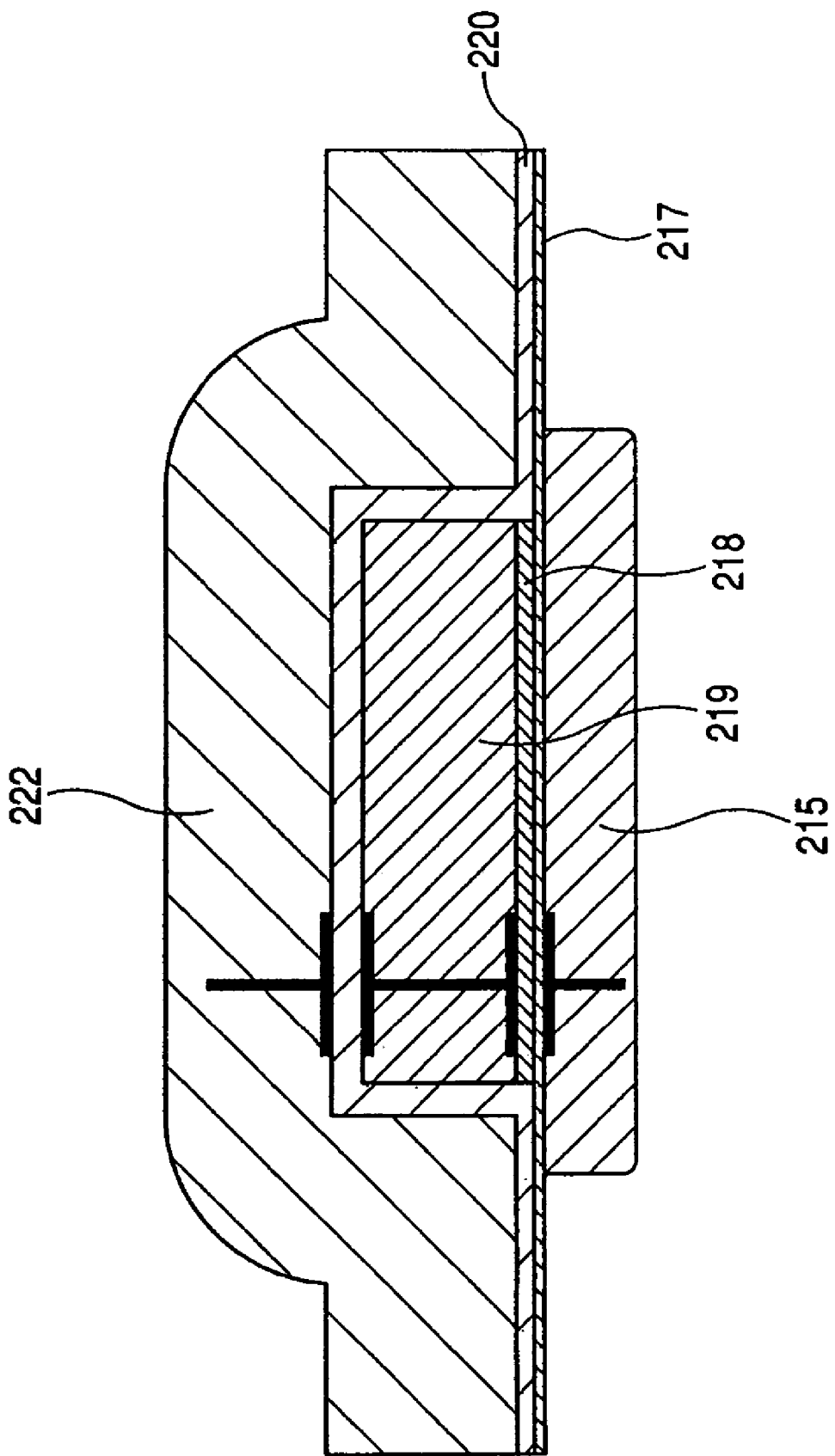

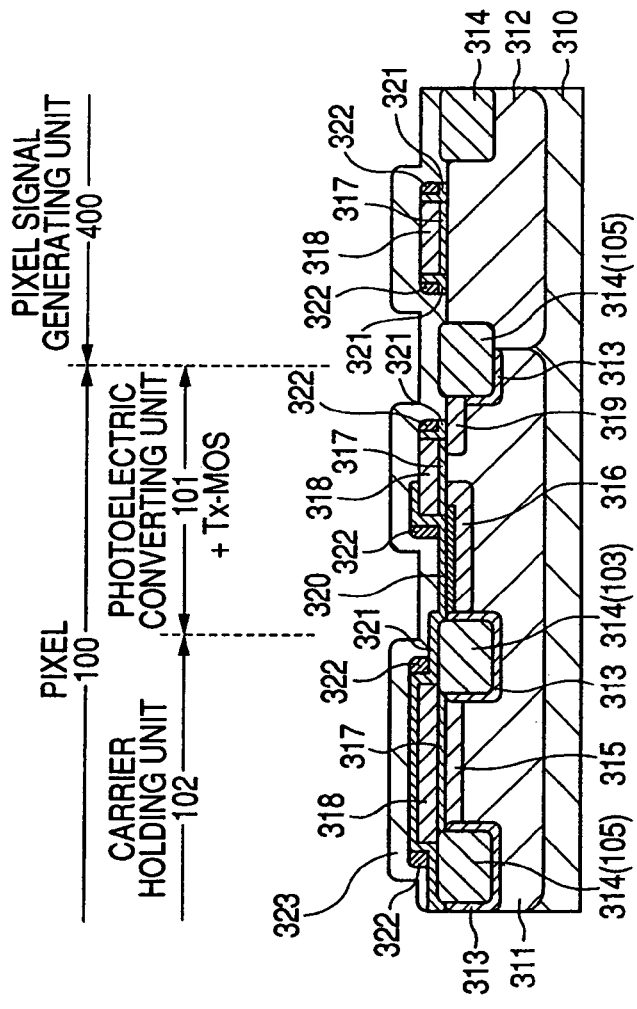
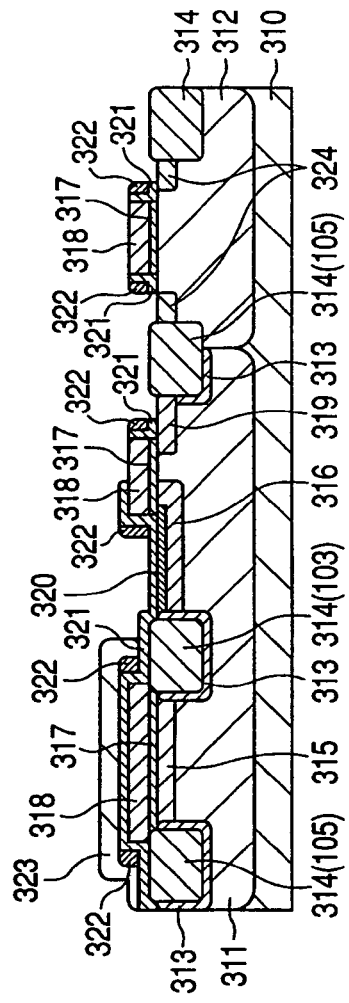
FIG. 12A
FIG. 12B

PRODUCING METHOD FOR SOLID-STATE IMAGE PICKUP DEVICE INCLUDING FORMATION OF A CARRIER ACCUMULATING REGION

BACKGROUND OF THE INVENTION

1. Field of the Invention

The present invention relates to a method for producing a solid-state image pickup device including a photoelectric conversion region for generating and accumulating a carrier by photoelectric conversion.

2. Related Background Art

Recently, a MOS sensor is being employed as a solid-state image pickup device. The MOS sensor has advantages, in comparison with a CCD sensor, of a lower electric power consumption, a lower driving electric power and a high-speed operation. The demand for such MOS sensor is therefore anticipated to grow hereafter.

With such MOS sensor, proposals have been made to expand a dynamic range of the solid-state image pickup device (cf. Japanese Patent Application Laid-open No. 2001-186414, corresponding to U.S. Pat. No. 6,307,195). In such proposal, the MOS sensor is constituted of pixels, each formed for example by a photodiode, a floating diffusion (FD) region, a transfer transistor for transferring a carrier from the photodiode to the FD region, and a reset transistor for resetting the FD region to a predetermined potential, and a plurality of such pixels are arranged in a matrix.

In such MOS sensor, a signal based on a carrier accumulated in the photodiode is read out, and then a signal based on a carrier overflowing from the photodiode and accumulated in the FD region is read, and the read signals are outputted through an analog amplifier.

Also another method has been proposed (cf. Shigetoshi Sugawa et al., "A 100 db Dynamic Range CMOS Image Sensor Using a lateral Overflow Integration Capacitor", ISSCC 2005/SESSION 19/IMAGES/19.4, DIGEST OF TECHNICAL PAPERS, 2005 IEEE International Solid-State Circuit Conference, Feb. 8, 2005, p 352-353, 603). In the CMOS area sensor in this non-patent reference, a capacitor region of a capacity larger than that of the FD region is formed in each pixel, and a terminal of the capacitor region is connected with the FD region through a switch, while the other terminal of the capacitor region is connected to the ground. Thus, when a strong light causes a carrier overflow from the photodiode, such overflowing carrier is held in the capacitor region to enable a signal output corresponding to the amount of such overflowing carrier, thereby expanding the dynamic range.

However the aforementioned prior technologies, in the solid-state image pickup device provided with pixels having MOS transistors, have not paid at all attention to the aspect of enabling manufacture without complicating the manufacturing process. Therefore, an improvement in the productivity cannot be attained in such solid-state image pickup device.

The present invention has been made in consideration of the aforementioned situation, and an object of the present invention is to provide a producing method for a solid-state image pickup device, capable of simplifying the manufacturing process for a solid-state image pickup device having pixels each including a MOS transistor, thereby realizing an improvement in the productivity of such solid-state image pickup device.

SUMMARY OF THE INVENTION

The present invention provides a method for producing a solid-state image pickup device including pixels each including a photoelectric conversion region for generating photoelectrically a carrier and accumulating the carrier generated by the photoelectric conversion, a carrier accumulating portion for accumulating a carrier overflowing from the photoelectric conversion region during a period in which the photoelectric conversion region generates and accumulates the carrier; and a MOS transistor arranged correspondingly to the photoelectric conversion region, wherein the carrier accumulating portion is formed by a step of forming a first dielectric film on a semiconductor substrate, a step of forming a first electroconductive film of a predetermined shape on the first dielectric film, a step of forming a second dielectric film on the first electroconductive film, and a step of forming a second electroconductive film on the second dielectric film, and a gate electrode of the MOS transistor is formed by the same step as the step of forming the first electroconductive film or the step of forming the second electroconductive film.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 8A, 8B and 8C are schematic cross-sectional views showing producing steps for the solid-state image pickup device in a second embodiment of the present invention;

FIGS. 9A, 9B and 9C are schematic cross-sectional views showing producing steps for the solid-state image pickup device in the second embodiment of the present invention, succeeding to those steps shown in FIGS. 8A, 8B and 8C;

FIG. 10 is a schematic cross-sectional view of a carrier accumulating portion in the second embodiment;

FIGS. 12A and 12B are schematic cross-sectional views showing producing steps for the solid-state image pickup device in the third embodiment of the present invention, succeeding to those steps shown in FIGS. 11A, 11B and 11C;

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The present invention allows to simplify a producing process for a solid-state image pickup device with pixels including MOS transistors, thereby realizing an improvement in the productivity of the solid-state image pickup device.

First Embodiment

Figure 1:
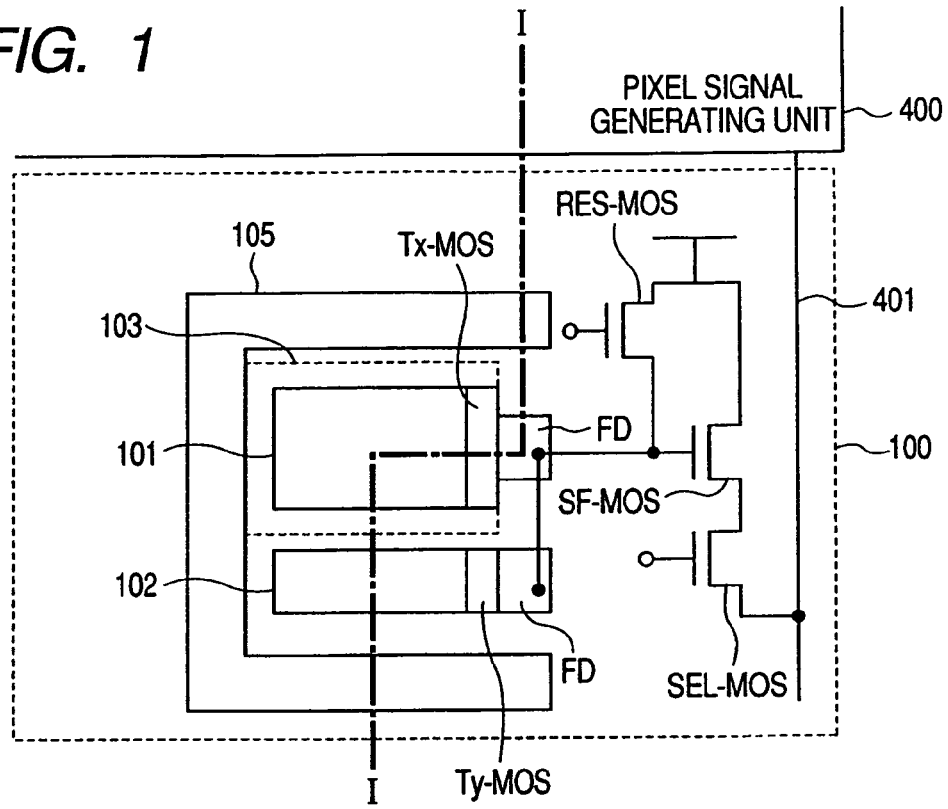
FIG. 1 is a view showing a structure of a solid-state image pickup device in a first embodiment of the present invention.

FIG. 1 illustrates a structure of a solid-state image pickup device in a first embodiment of the present invention. The solid-state image pickup device is constituted of a two-dimensional array of such pixel 100. The pixels 100 are connected, through a signal line 401, to a pixel signal generating portion 400. In the following, an n-channel MOS field effect transistor will be simply called a MOS transistor. A pixel 100 is equipped with transfer MOS transistors Tx-MOS, Ty-MOS, a resetting MOS transistor RES-MOS, a source-follower MOS transistor SF-MOS and a selecting MOS transistor SEL-MOS.

The transfer MOS transistor Tx-MOS is connected, at a source and a drain thereof, respectively to a photoelectric conversion region (photodiode) 101 and a floating diffusion region FD. The transfer MOS transistor Ty-MOS is connected, at a source and a drain thereof, respectively to a carrier accumulating portion 102 and the floating diffusion region FD.

The photoelectric conversion region 101 is surrounded by an element isolation region 103. The element isolation region 103 has a potential barrier higher than a carrier to be accumulated in the photoelectric conversion region 101, so that the photoelectric conversion region 101 can accumulate a carrier of a predetermined quantity. A carrier accumulating portion 102 is provided below, in FIG. 1, the photoelectric conversion region 101, across the element isolation region 103. The photoelectric conversion region 101 is exposed, while the carrier accumulating portion 102 is shielded from the light. Around the photoelectric conversion region 101 and the carrier accumulating portion 102, an element isolation portion 105 is provided to prevent a carrier leakage from the pixel to adjacent pixels.

The photoelectric conversion region 101 generates and accumulates a carrier by photoelectric conversion. The floating diffusion region FD is a diffusion region for accumulating a carrier and converting it into a voltage. A gate of the transfer MOS transistor Tx-MOS is used as a transfer gate for transferring the carrier, generated in the photoelectric conversion region 101, to the floating diffusion region FD. By closing such transfer gate, the photoelectric conversion region 101 can generate a carrier by photoelectric conversion and accumulate it. After an accumulation time, the transfer gate is opened to transfer (read out) the carrier, accumulated in the photoelectric conversion region 101, to the floating diffusion region FD.

The pixel signal generating portion 400 generates a pixel signal according to the carrier accumulated in the photoelectric conversion region 101 and the carrier accumulated in the carrier accumulating portion 102.

Figure 2:
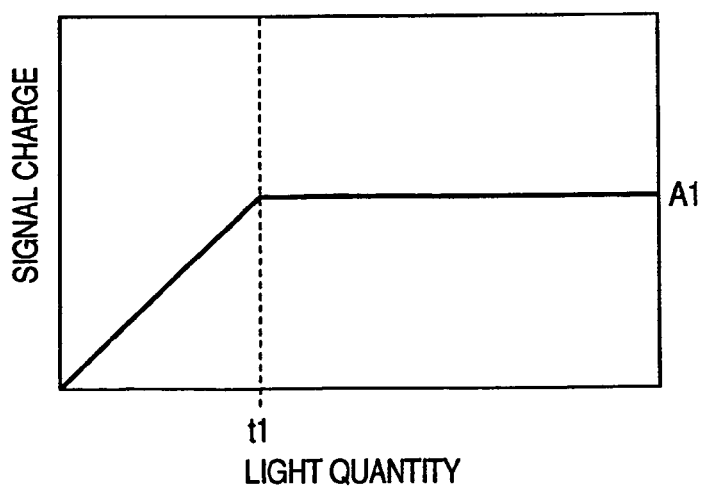
FIG. 2 is a characteristic chart showing a relationship between a light quantity in the photoelectric conversion region and a signal carrier.

FIG. 2 is a characteristic chart showing a relation between a light quantity in the photoelectric conversion region 101 and a signal carrier.

The photoelectric conversion region 101 has a predetermined amount A1 of signal carrier that can be accumulated. Therefore, when the photoelectric conversion region 101 is exposed to a strong light, the carrier overflows from the photoelectric conversion region 101, which becomes saturated at a light quality t1. The carrier overflowing from the photoelectric conversion region 101 flows into the carrier accumulating portion 102.

When the photoelectric conversion region 101 is irradiated with light, the photoelectric conversion region 101 accumulates a carrier up to the light quantity t1, while a carrier is not accumulated in the carrier accumulating portion 102. At the light quantity t1, the photoelectric conversion region 101 is saturated, and a carrier overflowing therefrom flows into the carrier accumulating portion 102, which thus starts to accumulate the carrier.

A negative carrier generated by a photoelectric conversion in the photoelectric conversion region 101 is accumulated in a carrier accumulating region of a first conductive type (n-type) of the photoelectric conversion region 101. The photoelectric conversion region 101 is connected, through a first transfer portion (transfer MOS transistor Tx-MOS), to the source-follower MOS transistor SF-MOS constituting a source-follower amplifier. The carrier accumulating portion 102 is connected, through a second transfer portion (transfer MOS transistor Ty-MOS), to the source-follower MOS transistor SF-MOS constituting a source-follower amplifier. The source-follower amplifier amplifies the signal carriers of the photoelectric conversion region 101 and the carrier accumulating portion 102.

Figure 3:
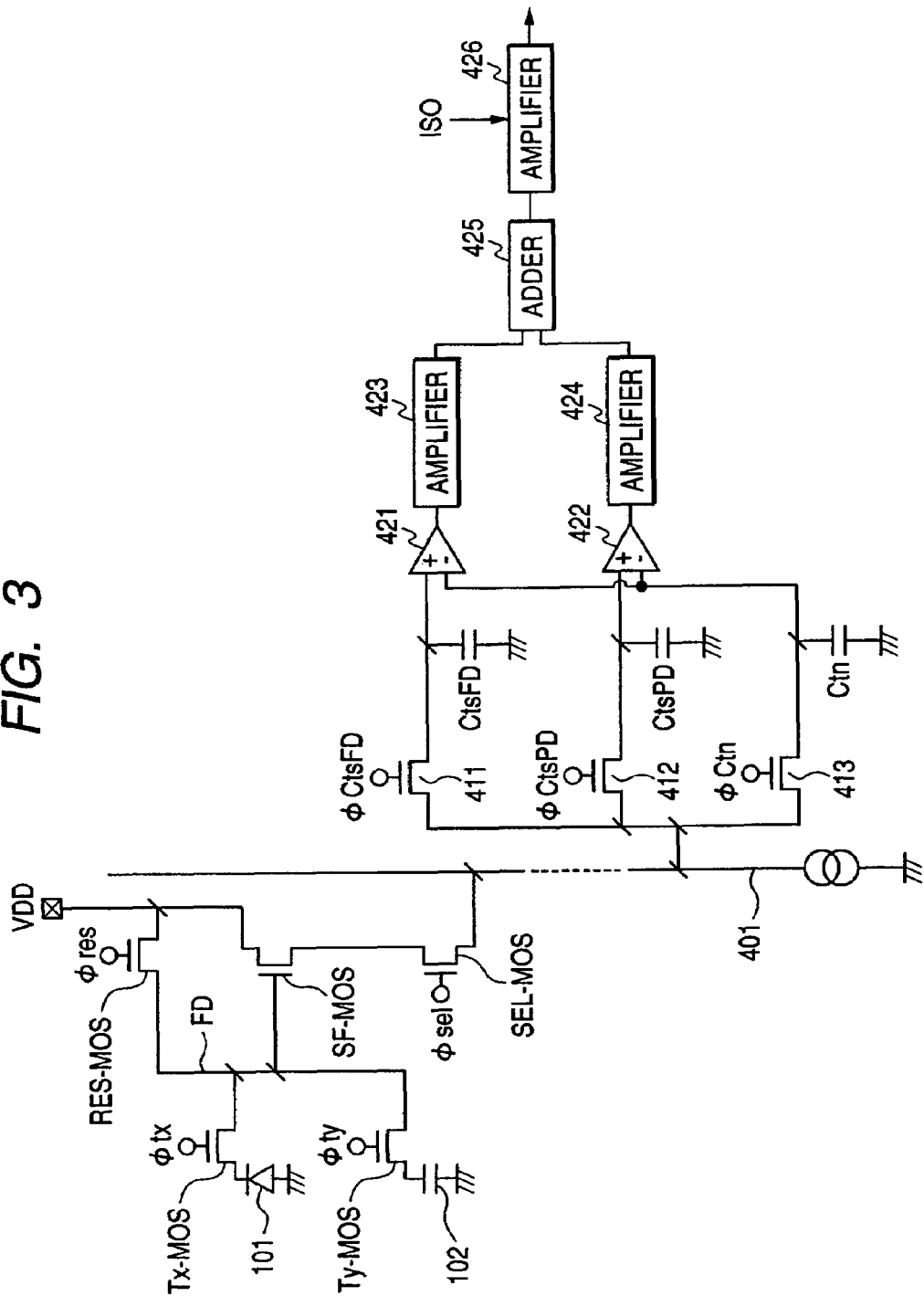
FIG. 3 is an equivalent circuit diagram of a solid-state image pickup device in the first embodiment of the present invention.

FIG. 3 is an equivalent circuit diagram of the solid-state image pickup device of the first embodiment of the present invention.

In FIG. 3, there are shown a pixel 100 shown in FIG. 1, and a pixel signal generating portion 400 for generating a pixel signal according to the carrier accumulated in the photoelectric conversion region 101 and the carrier accumulated in the carrier accumulating portion 102. More specifically, the pixel signal generating portion 400 in the present embodiment is provided with transistors 411-413 and capacitors CtsFD, CtsPD and Ctn. Also FIG. 4 is a timing chart showing an example of function of the equivalent circuit shown in FIG. 3.

There are shown a gate potential $\phi$res of the reset MOS transistor RES-MOS, a gate potential $\phi$tx of the transfer MOS transistor Tx-MOS, a gate potential $\phi$ty of the transfer MOS transistor Ty-MOS, a gate potential $\phi$sel of the selecting MOS transistor SEL-MOS, a gate potential $\phi$CtsFD of a MOS transistor 411, a gate potential $\phi$CtsPD of a MOS transistor 412, and a gate potential $\phi$Ctn of a MOS transistor 413.

Figure 4:
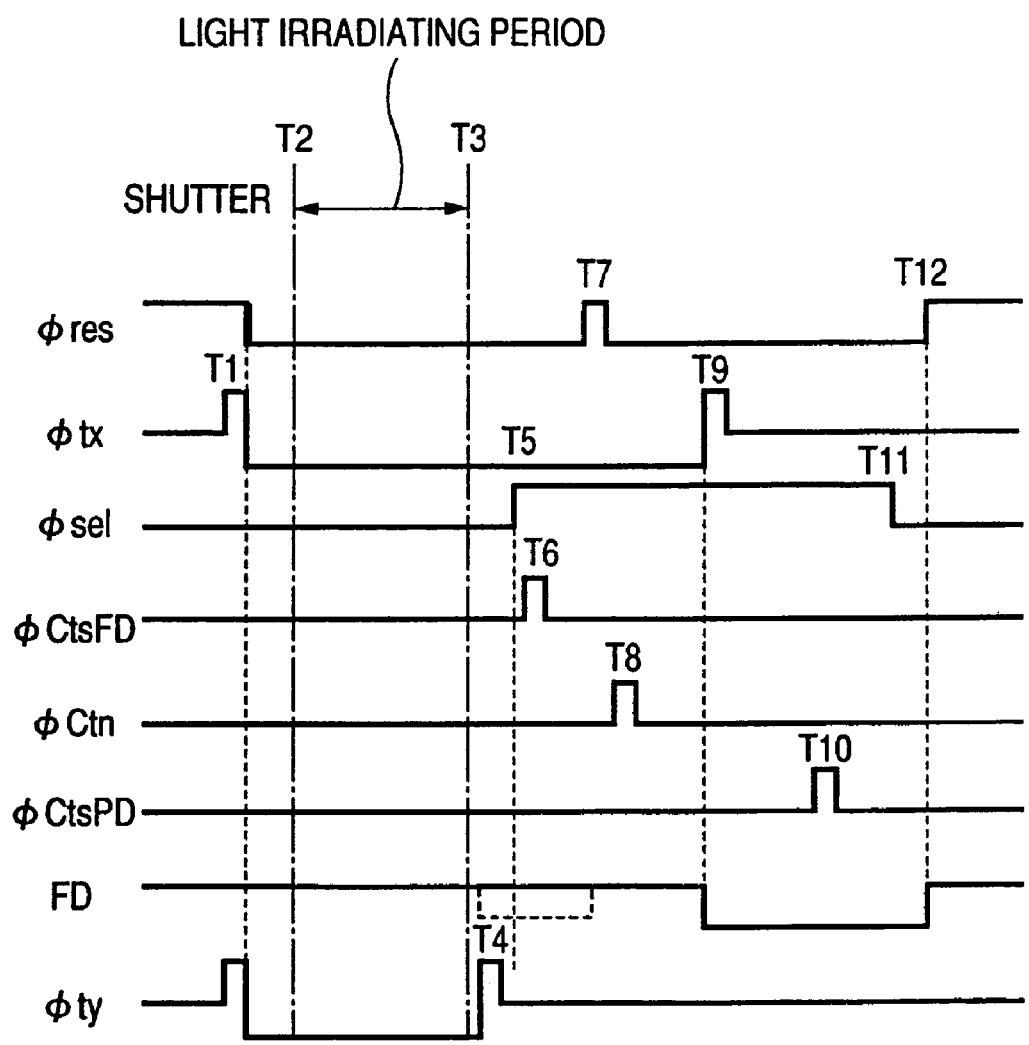
FIG. 4 is a timing chart showing a function of the equivalent circuit of the solid-state image pickup device shown in FIG. 3.

Referring to FIG. 4, prior to a timing T1, $\phi$res assumes a positive potential, while $\phi$fx, $\phi$ty, $\phi$sel, $\phi$CtsFD, $\phi$Ctn and $\phi$CtsPD is at 0 V. Thus the reset MOS transistor RES-MOS is turned on and a power supply potential VDD is supplied to the floating diffusion region FD.

Then at a timing T1, positive pulses are supplied as $\phi$tx and $\phi$ty. The transfer MOS transistors Tx-MOS and Ty-MOS are turned on to apply the power supply potential VDD thereby resetting the floating diffusion region FD, the photoelectric conversion region 101 and the carrier accumulating portion 102. After the resetting, φres is lowered to 0 V, thereby turning off the reset MOS transistor RES-MOS. Then φtx and φty are lowered for example to −1.3 V to maintain the photoelectric conversion region 101, the carrier accumulating portion 102 and the floating diffusion region FD in a floating state. At this point, however, an external mechanical shutter is not yet opened, so that the photoelectric conversion region 101 does not initiate a photocarrier accumulation.

Then, at a timing T2, a mechanical shutter 53 (FIG. 14) is opened to introduce light to the photoelectric conversion region 101, which thus initiates generation and accumulation of a photocarrier. When the photoelectric conversion region 101 is irradiated with a weak light, it is not saturated so that a carrier flow from the photoelectric conversion region 101 to the carrier accumulating portion 102 does not take place. In contrast, when the photoelectric conversion region 101 is irradiated with a strong light, it is saturated to cause a carrier flow therefrom to the carrier accumulating portion 102.

Then, in a timing T3, the shutter 53 is closed to shield the photoelectric conversion region 101, thereby terminating the photocarrier generation therein.

Then, at a timing T4, a positive pulse is applied as honeycomb ty, thereby turning on the transfer MOS transistor Ty-MOS, whereby a negative carrier accumulated in the carrier accumulating portion 102 is read out to the floating diffusion region FD. As regards the potential of the floating diffusion region FD, a solid line indicates a case of irradiation with a weak light, not causing a carrier overflow from the photoelectric conversion region 101 to the carrier accumulating portion 102. A broken line indicates a case of irradiation with a strong light, inducing a carrier overflow from the photoelectric conversion region 101 to the carrier accumulating portion 102. When the negative carrier is read out from the carrier accumulating portion 102 to the floating diffusion region FD, the potential thereof is lowered.

Then, at a timing T5, φsel is shifted from 0 V to a positive potential. The selecting MOS transistor SEL-MOS is thus turned on to activate the signal output line 401 shown in FIG. 3. The source-follower MOS transistor SD-MOS, constituting a source-follower amplifier, outputs an output voltage to the signal output line 401 according to the potential of the floating diffusion region FD.

At a timing T6, a positive pulse is applied as φCtsFD. The transistor 411 is turned on to accumulate, in a capacity CtsFD, the potential of the signal output line 401 corresponding to the potential of the floating diffusion region FD. In a pixel in which the photoelectric conversion region 101 is not saturated, since the carrier does not overflow to the carrier accumulating portion 102, an output is accumulated, in the capacity CtsFD, corresponding to the reset voltage VDD of the floating diffusion region FD. Also in case the photoelectric conversion region 101 is irradiated with a strong light and saturated, an output lower than the reset voltage VDD of the floating diffusion region FD is accumulated in the capacity CtsFD.

Then, at a timing T7, a positive pulse is applied as φres. The reset MOS transistor RES-MOS is turned on and the floating diffusion region FD is again reset to the power supply potential VDD.

Then, at a timing T8, a positive pulse is applied as φCtn. The MOS transistor 413 is turned on and an offset noise voltage of the signal output line 401, in the reset state of the floating diffusion region FD, is accumulated in the capacity Ctn.

Then, at a timing T9, a positive pulse is applied as φtx. The transfer MOS transistor Tx-MOS is turned on and the carrier accumulated in the photoelectric conversion region 101 is read out to the floating diffusion region FD.

At a timing T10, a positive pulse is applied as φCtsPD. The transistor 412 is turned on to accumulate, in a capacity CtsPD, the potential of the signal output line 401 corresponding to the carrier read out from the photoelectric conversion region 101 to the floating diffusion region FD.

Then, at a timing T11, φsel is shifted to 0 V. The selecting MOS transistor SEL-MOS is turned off to deactivate the signal output line 401.

At a timing T12, φres is shifted to a positive potential. The reset MOS transistor RES-MOS is turned on to fix the potential of the floating diffusion region FD at the power supply potential VDD.

Through the foregoing operations, the capacity Ctn accumulates a voltage corresponding to the offset noise, while the capacity CtsFD accumulates a voltage corresponding to the carrier overflown from the photoelectric conversion region 101 to the carrier accumulating portion 102, and the capacity CtsPD accumulates a voltage corresponding to the accumulated carrier in the photoelectric conversion region 101.

In FIG. 3, a differential amplifier 421 outputs a voltage corresponding to the signal voltage of the capacity CtsFD minus the noise voltage of the capacity Ctn. A differential amplifier 422 outputs a voltage corresponding to the signal voltage of the capacity CtsPD minus the noise voltage of the capacity Ctn. An amplifier 423 amplifies the output signal of the differential amplifier 421, and an amplifier 424 amplifies the output signal of the differential amplifier 422.

A common amplifying circuit, namely a same readout path, is used within a pixel for the signal of the carrier accumulating portion 102 and the signal of the photoelectric conversion region 101, thereby allowing to suppress a slight sensitivity error or an offset error in case of employing different paths. As a result, an amplification by an amplifier in a later stage is made possible. In particular, such amplification by an amplifier in a later stage is required for expanding the dynamic range, and is made possible by employing a same path.

An adder 425 adds the output signals of the amplifiers 423, 424 to output a pixel signal. The pixel signal, being generated from the carrier accumulated in the photoelectric conversion region 101 and the carrier overflown to the carrier accumulating portion 102, can have an expanded dynamic range in comparison with a case of utilizing the carrier accumulated in the photoelectric conversion region 101 only.

An amplifier 426 amplifies the output signal of the adder 425 according to an ISO sensitivity, and has a small or large amplification factor respectively for a low or high ISO sensitivity.

In the following, there will be explained a producing method for a solid-state image pickup device, featuring the present invention.

FIGS. 5A-5C and 6A-6C are schematic cross-sectional views showing manufacturing steps of the solid-state image pickup device in the first embodiment of the present invention. FIGS. 5A-5C and 6A-6C are cross-sectional views along a line I-I in FIG. 1. In FIGS. 5A-5C and 6A-6C, p-channel MOS transistors (PMOS transistors) formed in a region of the pixel signal generating portion 400 correspond to components 421-426 shown in FIG. 3.

At first a step shown in FIG. 5A will be explained.

At first, on a semiconductor substrate 110, a P-well 111 constituted of a P⁻ region is formed in a pixel-forming area 100, and an N-well 112 constituted of an n⁻ region is formed in an area for forming the pixel signal generating portion 400. Then a trench is formed in an element isolation portion-forming area for defining an area for forming the carrier accumulating portion 102, the photoelectric conversion region 101 and the transfer MOS transistor Tx-MOS, and an area for forming the pixel signal generating portion 400. Then an impurity is introduced on an internal wall of the trench in the area for forming the pixel 100, thereby forming a p⁺ layer 113. The p⁺ layer 113 functions as a channel stop region.

Then in order to separate each forming area, the trench is filled in for example by forming an element isolation portion 114 of a silicon oxide film. The element isolation portion 114, defining the area for forming the photoelectric conversion region 101 and the transfer MOS transistor Tx-MOS and the area for forming the pixel signal generating portion 400, corresponds to the device isolation portion 105 in FIG. 1. Also the element isolation portion 114, defining the area for forming the photoelectric conversion region 101 and the transfer MOS transistor Tx-MOS and the area for forming the carrier accumulating portion 102, corresponds to the element isolation portion 103 in FIG. 1.

Then an impurity is introduced to the surface of the semiconductor substrate 110 in the area for forming the carrier accumulating portion 102, thereby forming an n⁺ layer 115. The n⁺ layer 115 functions as a lower electrode. Then an n⁻ layer 116 is formed in a predetermined area (forming area for the embedded photoelectric converting portion 101) on the surface of the semiconductor substrate 110, in the area for forming the photoelectric conversion region 101 and the transfer MOS transistor Tx-MOS.

Subsequently, a silicon oxide film 117 and a polysilicon film 118 are formed in succession on the semiconductor substrate 110 and are patterned in predetermined shapes in the respective forming areas. In thus manner, a polysilicon film 118 constituting an electrode is formed in the forming area for the carrier accumulating portion 102, and a polysilicon film 118 constituting gate electrodes is formed in the forming area for the photoelectric conversion region 101 and the transfer MOS transistor Tx-MOS and in the forming area for the pixel signal generating portion 400.

Then an impurity is introduced to form an n⁻ layer 119, on the surface of the semiconductor substrate 110 in the forming area for the photoelectric conversion region 101 and the transfer MOS transistor Tx-MOS at a side of the polysilicon film 118 closer to the forming area of the pixel signal generating portion 400. Then an impurity is introduced to form a p⁺ layer 120, on the surface of the semiconductor substrate 110 in the forming area for the photoelectric conversion region 101 and the transfer MOS transistor Tx-MOS at a side of the polysilicon film 118 closer to the forming area of the carrier accumulating portion 102. The p⁺ layer 120 serves to prevent a dark current generation in the photoelectric conversion region (photodiode) 101 of embedded structure.

Figure 5:
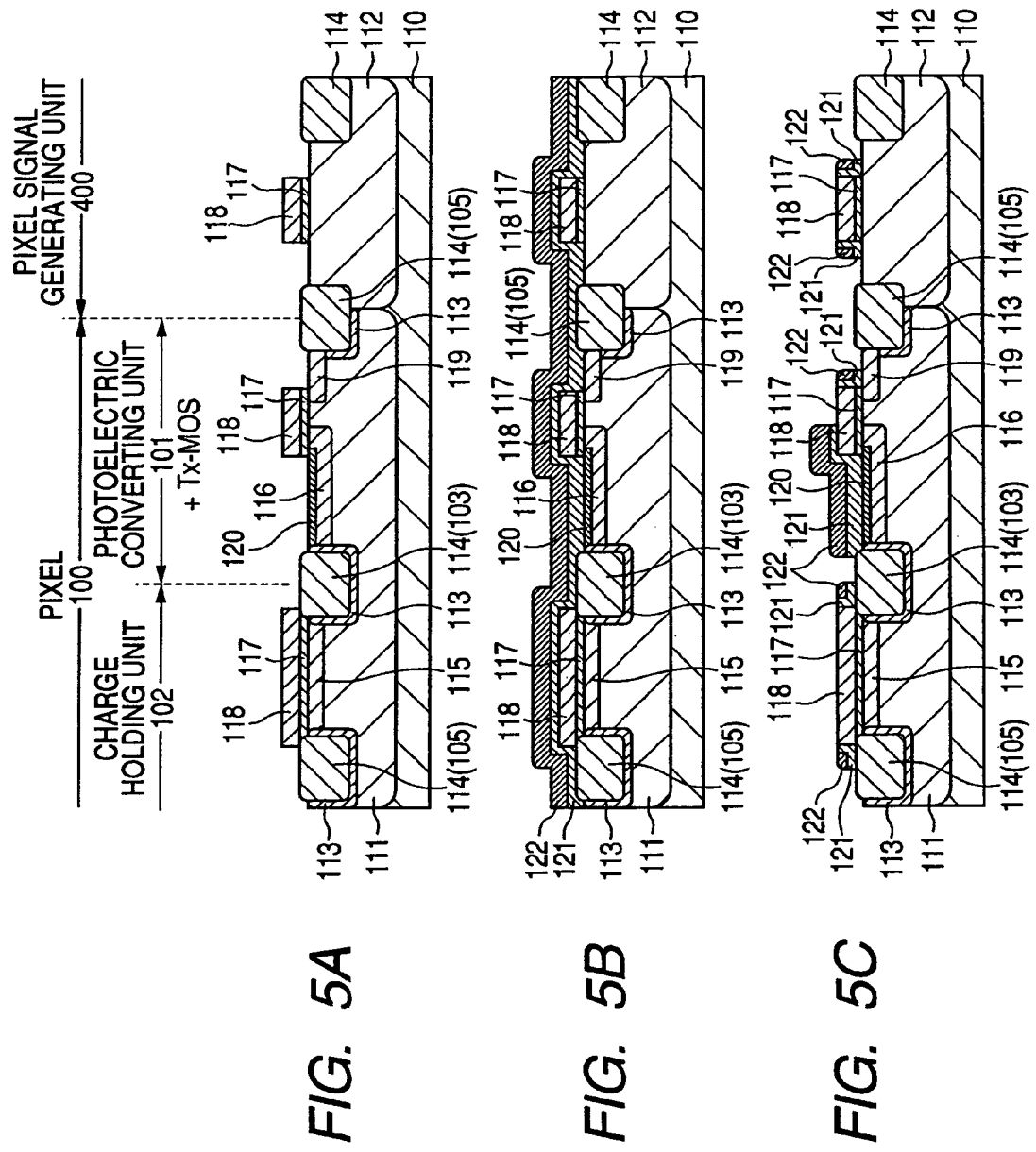
FIGS. 5A, 5B and 5C are schematic cross-sectional views showing producing steps for the solid-state image pickup device in the first embodiment of the present invention.

Then referring to FIG. 5B, a silicon nitride film 121 and a silicon oxide film 122 are formed in succession over the entire surface of the substrate 110.

Then referring to FIG. 5C, a resist pattern (not shown) is formed so as to cover top of the n⁻ layer 116, and the silicon oxide film 122 is etched. Thus the silicon oxide film 122 remains only on side walls of the polysilicon film 118 in each forming area. Then the silicon nitride film 121 is etched, utilizing a resist pattern (not shown) and the silicon oxide film 122 as a mask. Thereafter the resist pattern (not shown) is removed.

As a result, in the forming area for the photoelectric conversion region 101 and the transfer MOS transistor Tx-MOS, the silicon nitride film 121 and the silicon oxide film 122 are so formed as to cover top part of the n⁻ layer 116, and the silicon nitride film 121 and the silicon oxide film 122 remain on a side wall of the polysilicon film 118 at a side of the forming area for the pixel signal generating portion 400. The silicon nitride film 121, so formed as to cover top of the n⁻ layer 116, covers a light-receiving surface of the embedded photoelectric conversion region (photodiode) 101. The silicon nitride film 121 functions as an antireflection film for reducing a reflection of an external incident light at the interface of the semiconductor substrate 110, thereby efficiently introducing the incident light into the photoelectric conversion region (photodiode) 101 embedded in the semiconductor substrate 110. Also in the forming area for the carrier accumulating portion 102 and the forming area for the pixel signal generating portion 400, the silicon nitride film 121 and the silicon oxide film 122 remain only on side walls of the polysilicon film 118.

Figure 6:
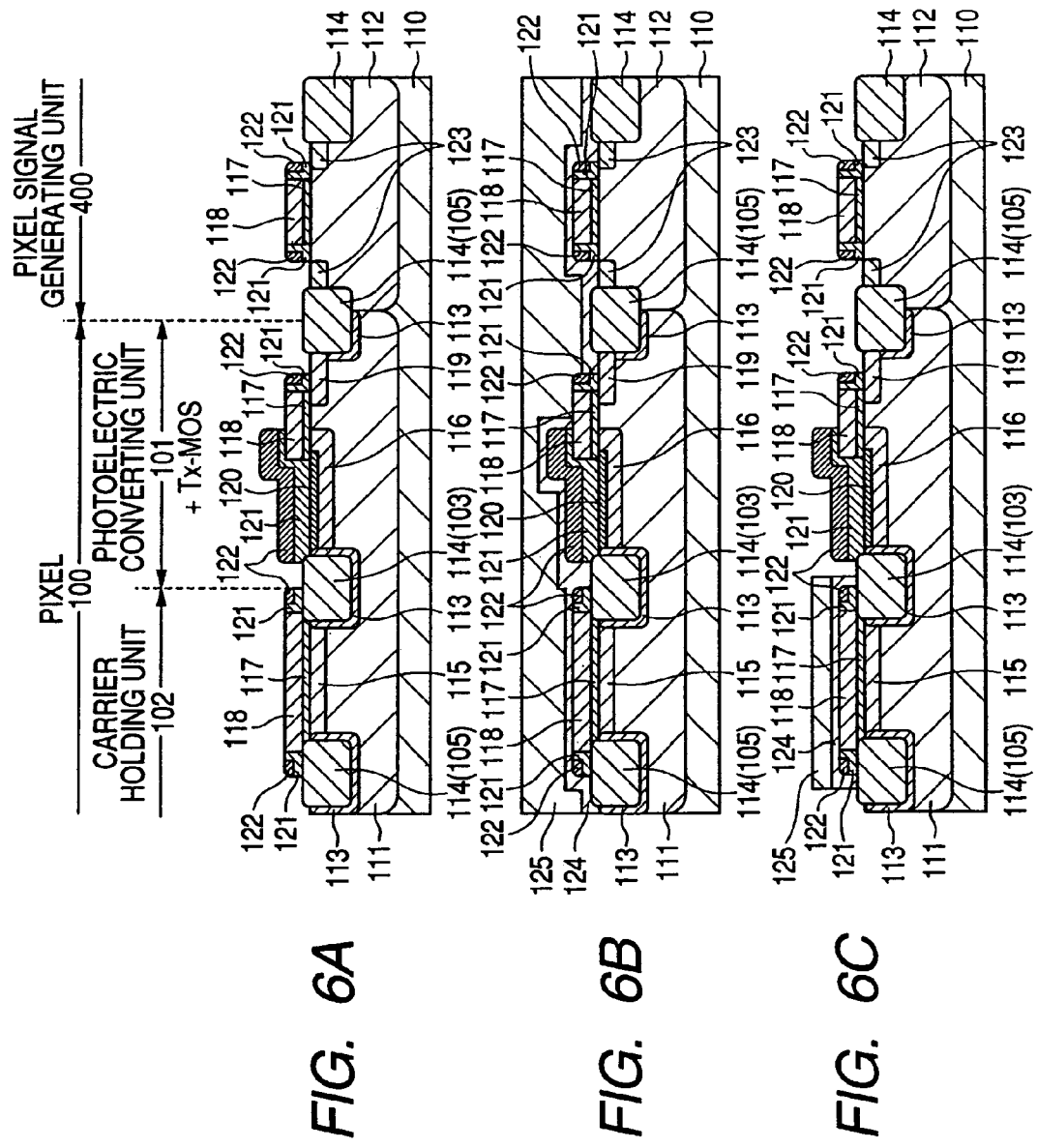
FIGS. 6A, 6B and 6C are schematic cross-sectional views showing producing steps for the solid-state image pickup device in the first embodiment of the present invention, succeeding to those steps shown in FIGS. 5A, 5B and 5C.

Then referring to FIG. 6A, an impurity is introduced to form a p⁺ layer 123 in a PMOS transistor forming area in the forming area for the pixel signal generating portion 400. The p⁺ layer 123 functions as source/drain of the PMOS transistor. Also an impurity is introduced to form an n⁺ layer in other NMOS transistor-forming areas thereby constructing source/drain of the NMOS transistors.

Then referring to FIG. 6B, a silicon nitride film 124 and a silicon oxide film 125 are formed in succession over the entire surface of the substrate 110.

Then referring to FIG. 6C, a resist pattern (not shown) is formed so as to cover only the forming area of the carrier accumulating portion 102, and the silicon oxide film 125 is etched. Thus the silicon oxide film 125 remains only in the forming area for the carrier accumulating portion 102. Then the silicon nitride film 124 is etched. Thereafter, the resist pattern (not shown) is removed. Thereafter, steps of forming interlayer insulation films, contact holes and wiring layers to complete the solid-state image pickup device of the first embodiment.

Figure 7:
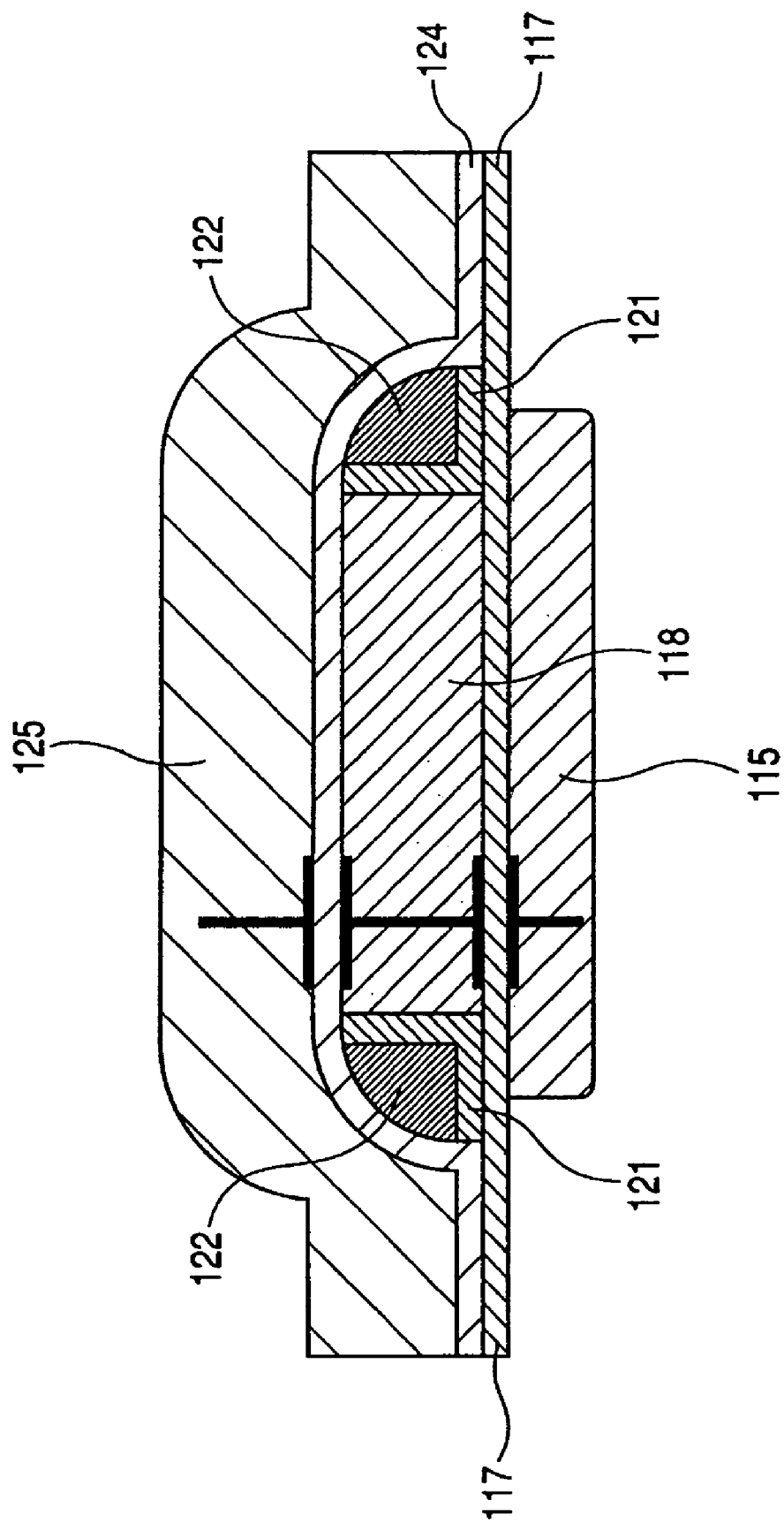
FIG. 7 is a schematic cross-sectional view of a carrier accumulating portion in the first embodiment.

FIG. 7 is a schematic cross-sectional view of the carrier accumulating portion 102 in the first embodiment.

In the carrier accumulating portion 102 of the first embodiment, the silicon oxide film 117 functions as a first dielectric layer between the n⁺ layer 115 constituting the lower electrode and the polysilicon film 118 constituting a first conductive film. The silicon nitride film 124 functions as a second dielectric film between the polysilicon film 118 constituting the first conductive film and the polysilicon film 125 constituting a second conductive film. Also depending on the manufacturing process, a silicon oxide film may be formed between the silicon nitride film 121 and the silicon nitride film 124. In the present embodiment, since the upper electrode of the carrier accumulating portion 102 has a 2-layered structure (polysilicon films 118 and 125), the capacity can be increased by a connection.

In the producing method for the solid-state image pickup device of the first embodiment, the gate electrode of the transfer MOS transistor Tx-MOS is formed, as shown in FIG. 6C, by the polysilicon film 118, which is formed in a same step (FIG. 5A) as that for the polysilicon film 118 (first conductive film) constituting the electrode of the carrier accumulating portion 102.

The first embodiment, in which the gate electrode of the transfer MOS transistor Tx-MOS is formed in a same step as the polysilicon film 118 constituting the first conductive film of the carrier accumulating portion 102, can simplify the producing process for the solid-state image pickup device provided with pixels having MOS transistors, thereby improving the productivity of the solid-state image pickup device.

Second Embodiment

FIGS. 8A-8C and 9A-9C are schematic cross-sectional views showing manufacturing steps of the solid-state image pickup device in the second embodiment of the present invention. FIGS. 8A-8C and 9A-9C are cross-sectional views along a line I-I in FIG. 1. In FIGS. 8A-8C and 9A-9C, p-channel MOS transistors (PMOS transistors) formed in a region of the pixel signal generating portion 400 correspond to components 421 to 426 shown in FIG. 3.

At first a step shown in FIG. 8A will be explained.

At first, on a semiconductor substrate 210, a P-well 211 constituted of a P$^-$ region is formed in a pixel-forming area 100, and an N-well 212 constituted of an n$^-$ region is formed in an area for forming the pixel signal generating portion 400. Then a trench is formed in an element isolation portion-forming area for defining an area for forming the carrier accumulating portion 102, the photoelectric conversion region 101 and the transfer MOS transistor Tx-MOS, and an area for forming the pixel signal generating portion 400. Then an impurity is introduced on an internal wall of the trench in the area for forming the pixel 100, thereby forming a p$^+$ layer 213. The p$^+$ layer 213 functions as a channel stop region.

Then in order to separate each forming area, the trench is filled in for example by forming an element isolation portion 214 of a silicon oxide film. The element isolation portion 214, defining the area for forming the photoelectric conversion region 101 and the transfer MOS transistor Tx-MOS and the area for forming the pixel signal generating portion 400, corresponds to the device isolation portion 105 in FIG. 1. Also the element isolation portion 214, defining the area for forming the photoelectric conversion region 101 and the transfer MOS transistor Tx-MOS and the area for forming the carrier accumulating portion 102, corresponds to the element isolation portion 103 in FIG. 1.

Then an impurity is introduced to the surface of the semiconductor substrate 210 in the area for forming the carrier accumulating portion 102, thereby forming an n$^+$ layer 215. The n$^+$ layer 215 functions as a lower electrode. Then an n$^-$ layer 216 is formed in a predetermined area (forming area for the embedded photoelectric converting portion 101) on the surface of the semiconductor substrate 210, in the area for forming the photoelectric conversion region 101 and the transfer MOS transistor Tx-MOS. Subsequently, a silicon oxide film 217, a silicon nitride film 218 and a polysilicon film 219 are formed in succession on the semiconductor substrate 210.

Then referring to FIG. 8B, a resist pattern (not shown) is formed so as to cover the forming area of the carrier accumulating portion 102, and the polysilicon film 219 and the silicon nitride film 218 are etched. Thus the polysilicon film 219 and the silicon nitride film 218 remain only in the forming area of the carrier accumulating portion 102. Thereafter the resist pattern (not shown) is removed.

Then referring to FIG. 8C, a silicon nitride film 220 is formed on the entire surface of the substrate 210.

Then referring to FIG. 9A, a resist pattern (not shown) is so formed as to cover the forming area of the carrier accumulating portion 102, and the silicon nitride film 220 and the silicon oxide film 127 are etched. Thereafter the resist pattern (not shown) is removed.

Then referring to FIG. 9B, a silicon oxide film 221 is formed in the forming area for the photoelectric conversion region 101 and the transfer MOS transistor Tx-MOS and the forming area for the pixel signal generating portion 400, and then a polysilicon film 222 is formed on the entire surface of the substrate 210.

Then, referring to FIG. 9C, a resist pattern (not shown) is so formed as to cover the forming area for the gate electrodes of the transfer MOS transistor Tx-MOS and the MOS transistor in the pixel signal generating portion 400 and in the forming area of the carrier accumulating portion 102. Thereafter the polysilicon film 222 and the silicon oxide film 217 are etched to obtain a polysilicon film 222 constituting gate electrodes of the transfer MOS transistor Tx-MOS and the MOS transistor in the pixel signal generating portion 400. Then the resist pattern (not shown) is removed.

Then an impurity is introduced to form an n$^-$ layer 223, on the surface of the semiconductor substrate 210 in the forming area for the photoelectric conversion region 101 and the transfer MOS transistor Tx-MOS at a side of the polysilicon film 222 closer to the forming area of the pixel signal generating portion 400. Then an impurity is introduced to form a p$^+$ layer 224, on the surface of the semiconductor substrate 210 in the forming area for the photoelectric conversion region 101 and the transfer MOS transistor Tx-MOS at a side of the polysilicon film 222 closer to the forming area of the carrier accumulating portion 102. The p$^+$ layer 224 serves to prevent a dark current generation in the photoelectric conversion region (photodiode) 101 of embedded structure.

Then an impurity is introduced to form a p$^+$ layer 225 in a PMOS transistor forming area in the forming area for the pixel signal generating portion 400. The p$^+$ layer 225 functions as source/drain of the PMOS transistor. Also an impurity is introduced to form an n$^+$ layer in other NMOS transistor-forming areas thereby constructing source/drain of the NMOS transistors. Thereafter, steps of forming inter-layer insulation films, contact holes and wiring layers to complete the solid-state image pickup device of the second embodiment.

FIG. 10 is a schematic cross-sectional view of the carrier accumulating portion 102 in the second embodiment.

In the carrier accumulating portion 102 of the second embodiment, the silicon oxide film 217 and the silicon nitride film 218 functions as a first dielectric film between the n$^+$ layer 215 constituting the lower electrode and the polysilicon film 219 constituting a first conductive film. The silicon nitride film 220 functions as a second dielectric film between the polysilicon film 219 constituting the first conductive film and the polysilicon film 222 constituting a second conductive film. As to the principal thickness of various components, the silicon oxide film 217 is about 2.0 nm, the silicon nitride film 218 is about 10.0 nm, and the silicon nitride film 220 is about 10.0 nm. In the present embodiment, since the upper electrode of the carrier accumulating portion 102 has a 2-layered structure (polysilicon films 219 and 222), the capacity can be increased by a connection.

In the producing method for the solid-state image pickup device of the second embodiment, the gate electrode of the transfer MOS transistor Tx-MOS is formed, as shown in FIG. 9C, by the polysilicon film 222, which is formed in a same step (FIG. 9B) as that for the polysilicon film 222 (second conductive film) constituting the electrode of the carrier accumulating portion 102.

The second embodiment, in which the gate electrode of the transfer MOS transistor Tx-MOS is formed in a same step as the polysilicon film 222 constituting the second conductive film of the carrier accumulating portion 102, can simplify the producing process for the solid-state image pickup device provided with pixels having MOS transistors, thereby improving the productivity of the solid-state image pickup device.

Third Embodiment

FIGS. 11A-11C and 12A-12C are schematic cross-sectional views showing manufacturing steps of the solid-state image pickup device in the third embodiment of the present invention. FIGS. 11A-11C and 12A-12C are cross-sectional views along a line I-I in FIG. 1. In FIGS. 11A-11C and 12A-12C, p-channel MOS transistors (PMOS transistors) formed in a region of the pixel signal generating portion 400 correspond to components 421-426 shown in FIG. 3.

At first a step shown in FIG. 11A will be explained.

At first, on a semiconductor substrate 310, a P-well 311 constituted of a P⁻ region is formed in a pixel-forming area 100, and an N-well 312 constituted of an n⁻ region is formed in an area for forming the pixel signal generating portion 400. Then a trench is formed in an element isolation portion-forming area for defining an area for forming the carrier accumulating portion 102, the photoelectric conversion region 101 and the transfer MOS transistor Tx-MOS, and an area for forming the pixel signal generating portion 400. Then an impurity is introduced on an internal wall of the trench in the area for forming the pixel 100, thereby forming a p⁺ layer 313. The p⁺ layer 313 functions as a channel stop region.

Then in order to separate each forming area, the trench is filled in for example by forming an element isolation portion 314 of a silicon oxide film. The element isolation portion 314, defining the area for forming the photoelectric conversion region 101 and the transfer MOS transistor Tx-MOS and the area for forming the pixel signal generating portion 400, corresponds to the device isolation portion 105 in FIG. 1. Also the element isolation portion 314, defining the area for forming the photoelectric conversion region 101 and the transfer MOS transistor Tx-MOS and the area for forming the carrier accumulating portion 102, corresponds to the element isolation portion 103 in FIG. 1.

Then an impurity is introduced to the surface of the semiconductor substrate 310 in the area for forming the carrier accumulating portion 102, thereby forming an n⁺ layer 315. The n⁺ layer 315 functions as a lower electrode. Then an n⁻ layer 316 is formed in a predetermined area (forming area for the embedded photoelectric converting portion 101) on the surface of the semiconductor substrate 310, in the area for forming the photoelectric conversion region 101 and the transfer MOS transistor Tx-MOS.

Subsequently, a silicon oxide film 317 and a polysilicon film 318 are formed in succession on the semiconductor substrate 310 and are patterned in predetermined shapes in the respective forming areas. In thus manner, a polysilicon film 318 constituting an electrode is formed in the forming area for the carrier accumulating portion 102, and a polysilicon film 318 constituting gate electrodes is formed in the forming area for the photoelectric conversion region 101 and the transfer MOS transistor Tx-MOS and in the forming area for the pixel signal generating portion 400.

Then an impurity is introduced to form an n⁻ layer 319, on the surface of the semiconductor substrate 310 in the forming area for the photoelectric conversion region 101 and the transfer MOS transistor Tx-MOS at a side of the polysilicon film 318 closer to the forming area of the pixel signal generating portion 400. Then an impurity is introduced to form a p⁺ layer 320, on the surface of the semiconductor substrate 110 in the forming area for the photoelectric conversion region 101 and the transfer MOS transistor Tx-MOS at a side of the polysilicon film 318 closer to the forming area of the carrier accumulating portion 102. The p⁺ layer 320 serves to prevent a dark current generation in the photoelectric conversion region (photodiode) 101 of embedded structure.

Figures 11A, 11B, 11C:
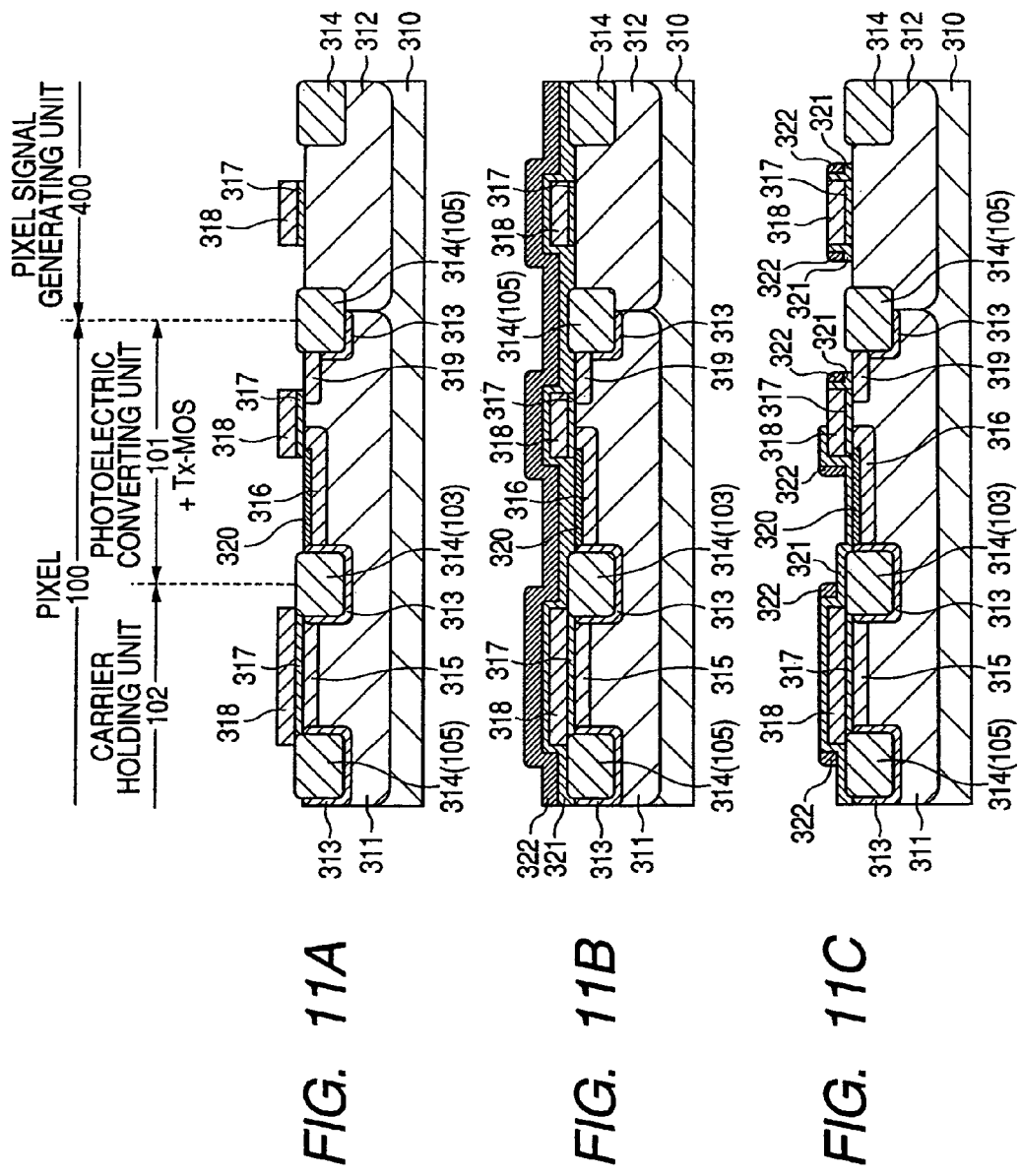
FIGS. 11A, 11B and 11C are schematic cross-sectional views showing producing steps for the solid-state image pickup device in a third embodiment of the present invention.

Then referring to FIG. 11B, a silicon nitride film 321 and a silicon oxide film 322 are formed in succession over the entire surface of the substrate 310.

Then referring to FIG. 11C, the silicon oxide film 322 is etched. Thus the silicon oxide film 322 remains only on side walls of the polysilicon film 318 in each forming area. Then a resist pattern (not shown) is so formed as to cover top of the forming area of the carrier accumulating portion 102 and the n⁻ layer 316, and the silicon nitride film 321 is etched. Thereafter the resist pattern (not shown) is removed.

As a result, in the forming area for the photoelectric conversion region 101 and the transfer MOS transistor Tx-MOS, the silicon nitride film 321 is so formed as to cover top portion of the n⁻ layer 316, and the silicon nitride film 321 and the silicon oxide film 322 remain on both side walls of the polysilicon film 318. The silicon nitride film 321, so formed as to cover top of the n⁻ layer 316, covers a light-receiving surface of the embedded photoelectric conversion region (photodiode) 101. The silicon nitride film 321 functions as an antireflection film for reducing a reflection of an external incident light at the interface of the semiconductor substrate 310, thereby efficiently introducing the incident light into the photoelectric conversion region (photodiode) 101 embedded in the semiconductor substrate 110. Also in the forming area for the carrier accumulating portion 102, the silicon oxide film 322 remains, across the silicon nitride film 321, only on both side walls of the polysilicon film 318. Also in the forming area for the pixel signal generating portion 400, the silicon nitride film 321 and the silicon oxide film 322 remain only on side walls of the polysilicon film 318.

Then referring to FIG. 12A, a polysilicon film 323 is formed over the entire surface of the substrate 310.

Then referring to FIG. 12B, a resist pattern (not shown) is so formed as to cover only the forming area of the carrier accumulating portion 102, and the polysilicon film is etched. Thus, the polysilicon film 23 remains only in the forming area of the carrier accumulating portion 102. Thereafter the resist pattern is removed.

Subsequently, an impurity is introduced to form a p⁺ layer 324 in a PMOS transistor forming area in the forming area for the pixel signal generating portion 400. The p⁺ layer 324 functions as source/drain of the PMOS transistor. Also an impurity is introduced to form an n⁺ layer in other NMOS transistor-forming areas thereby constructing source/drain of the NMOS transistors. Thereafter, steps of forming inter-layer insulation films, contact holes and wiring layers to complete the solid-state image pickup device of the third embodiment.

Figure 13:
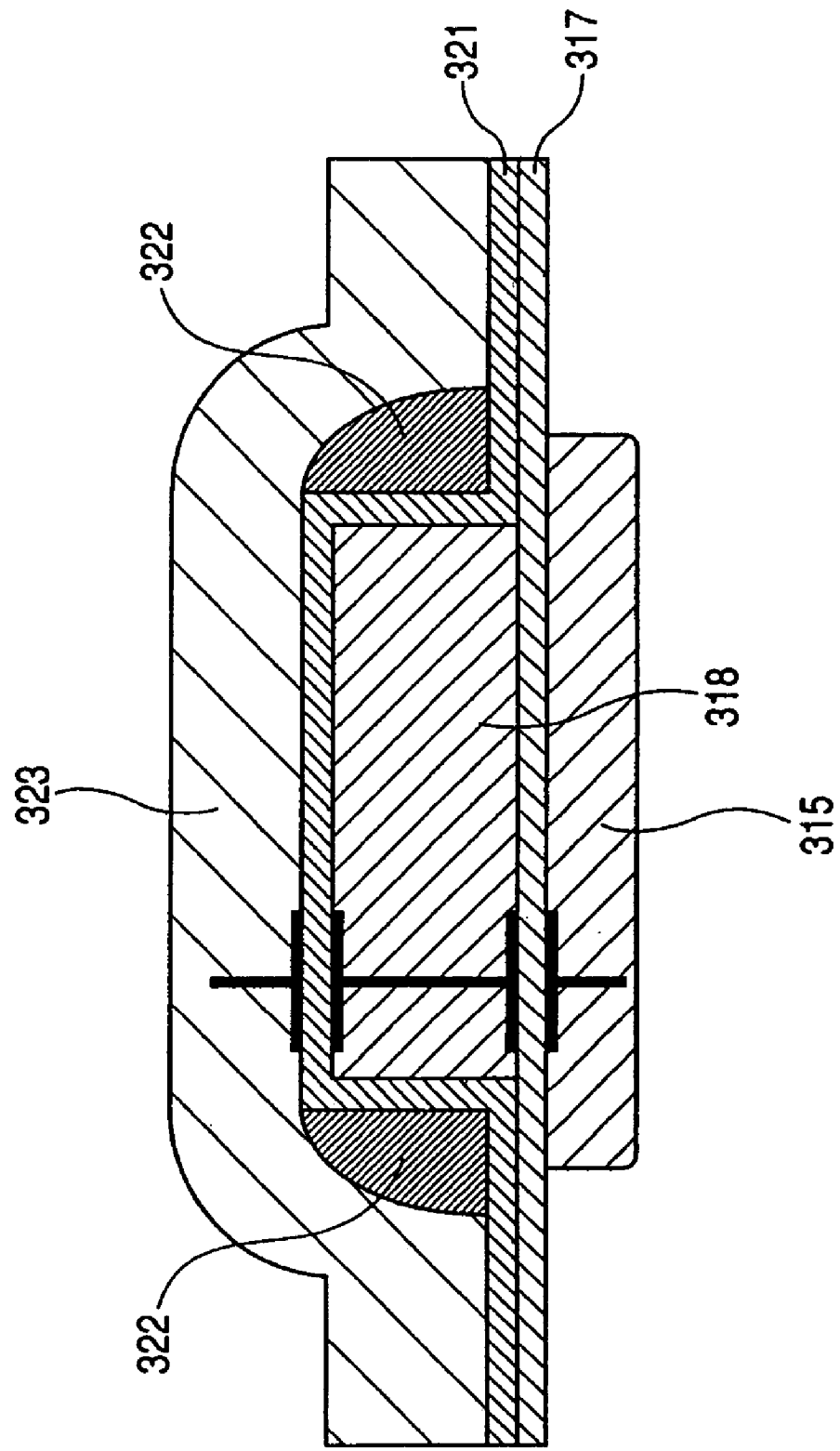
FIG. 13 is a schematic cross-sectional view of a carrier accumulating portion in the third embodiment.

FIG. 13 is a schematic cross-sectional view of the carrier accumulating portion 102 in the third embodiment.

In the carrier accumulating portion 102 of the third embodiment, the silicon oxide film 317 functions as a first dielectric layer between the n+ layer 315 constituting the lower electrode and the polysilicon film 318 constituting a first conductive film. The silicon nitride film 321 functions as a second dielectric film between the polysilicon film 318 constituting the first conductive film and the polysilicon film 323 constituting a second conductive film. In the present embodiment, since the upper electrode of the carrier accumulating portion 102 has a 2-layered structure (polysilicon films 315 and 321), the capacity can be increased by a connection.

In the producing method for the solid-state image pickup device of the third embodiment, the antireflection film for preventing reflection of the external incident light at the interface of the semiconductor substrate 310, as shown in FIG. 12B, is formed by the silicon nitride film 321, which is formed in a same step (FIG. 11C) as that for the silicon nitride film 118 functioning as the second dielectric film in the carrier accumulating portion 102. The present invention also includes an embodiment in which the antireflection film is formed by a same step as the first dielectric film of the carrier accumulating portion 102.

In the third embodiment, the gate electrode of the transfer MOS transistor Tx-MOS is formed in a same step as the polysilicon film 318 constituting the first conductive film in the carrier accumulating portion 102. Also the antireflective film, covering the top of the photoelectric conversion region 101 and preventing reflection of the incident light at the interface of the semiconductor substrate 310, is formed in a same step as the silicon nitride film 321 functioning as the second dielectric film in the carrier accumulating portion 102. It is therefore possible, in addition to the effects of the first embodiment, to achieve an efficient entry of the incident light into the photoelectric conversion region (photodiode) 101 of an embedded structure. Also for forming an LDD structure in the MOS transistor, the silicon nitride film for forming a side wall to be formed in the gate electrode may also be utilized as a dielectric film for forming an additional capacity. Also the silicon nitride films constituting the antireflective film and the side wall may be formed in a same step. Also the gate electrode of the MOS transistor and the electrode of the carrier accumulating portion are formed in a same step but may be prepared in separate steps.

Fourth Embodiment

Figure 14:
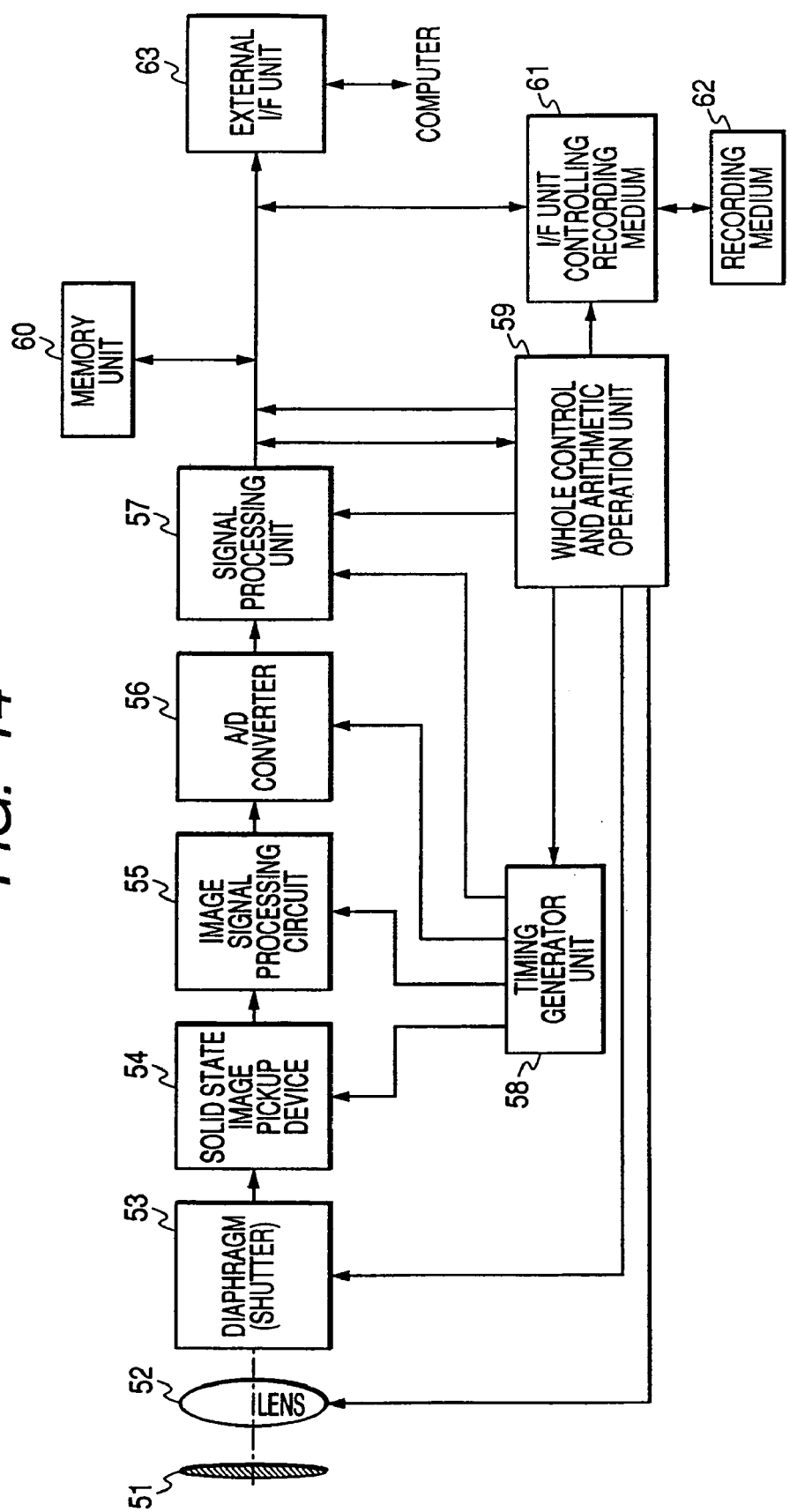
FIG. 14 is a block diagram showing a structure of a still video camera in a fourth embodiment of the present invention.

FIG. 14 is a block diagram showing a constitution of a still video camera constituting a fourth embodiment of the present invention. In the following, an example of application of the solid-state image pickup device of the first or second embodiment to a still video camera will be explained with reference to FIG. 14. The solid-state image pickup device of the first or second embodiment corresponds to a solid-state image pickup device 54 and an image signal processing circuit 55 therein.

In FIG. 14, there are shown a barrier 51 for lens protection and serving also as a main switch; a lens 52 for focusing an optical image of an object on a solid-state image pickup device 54; a diagram and a shutter 53 for varying a light quantity transmitted by the lens 52; a solid-state image pickup device 54 for fetching the object, focused by the lens 52, as an image signal; an image signal processing circuit 55 for executing an analog signal processing on the image signal from the solid-state image pickup device 54; an A/D converter 56 for executing an analog-to-digital conversion of the signal from the image signal processing circuit 55; a signal processing portion 57 for executing various corrections and data compression on the image data from the A/D converter 56; a timing generator 58 for outputting various timing signals to the solid-state image pickup device 54, image signal processing circuit 55, A/D-converter 56 and signal processing portion 57; a control/arithmetic operation portion 59 for executing various operations and controlling the entire still video camera, a memory 60 for temporarily storing image data; an interface 61 for recording on or reading from a recording medium 62; a detachable recording medium 62 such as a semiconductor memory for recording and reading image data; and an interface 63 for a communication with an external computer or the like.

In the following, there will be explained functions of the still video camera of the above-explained constitution at an image pickup operation.

When the barrier 51 is opened, the main power supply is turned on. Then power supply is turned on for a control system and then for an image pickup system such as the A/D converter 56. Then, in order to control an exposure amount, the control/arithmetic operation portion 59 fully opens the diaphragm 53, and a signal outputted from the image pickup device 54 is processed by the image signal processing circuit 55, then converted by the A/D converter 56 and is supplied to the signal processing portion 57. Based on such data, the control/arithmetic operation portion 59 calculates an exposure amount. A brightness is judged according to the result of such light metering, and the control/arithmetic operation portion 59 controls the diaphragm 53 according to the result.

Then a high-frequency component is extracted from the signal outputted from the image pickup device 54, and the control/arithmetic operation portion 59 calculates a distance to the object. It then drives the lens to judge whether it is in an in-focus state, and, if not in focus, it repeats the calculation by driving the lens again. After an in-focus state is confirmed, a main exposure is initiated by opening the shutter 53. When the exposure is terminated, an image signal outputted from the image pickup device 54 is processed by the image signal processing circuit 55, then subjected to an A/D conversion in the A/D converter 56, then transmitted by the signal processing portion 57 and is written into the memory 60 by the control/arithmetic operation portion 59. Then the data accumulated in the memory 60 are transmitted, under the control of the control/arithmetic operation portion 59, through the recording medium I/F 61 and recorded in the detachable recording medium 62 such as a semiconductor memory. Otherwise, the data may be directly supplied through the external I/F 63 to a computer or the like for image processing.

The timing generator 58 controls signals for the potentials $\phi$res, $\phi$tx, $\phi$ty, $\phi$sel, $\phi$CtsFD, $\phi$Ctn and $\phi$CtsPD shown in FIG. 4.

Fifth Embodiment

Figure 15:
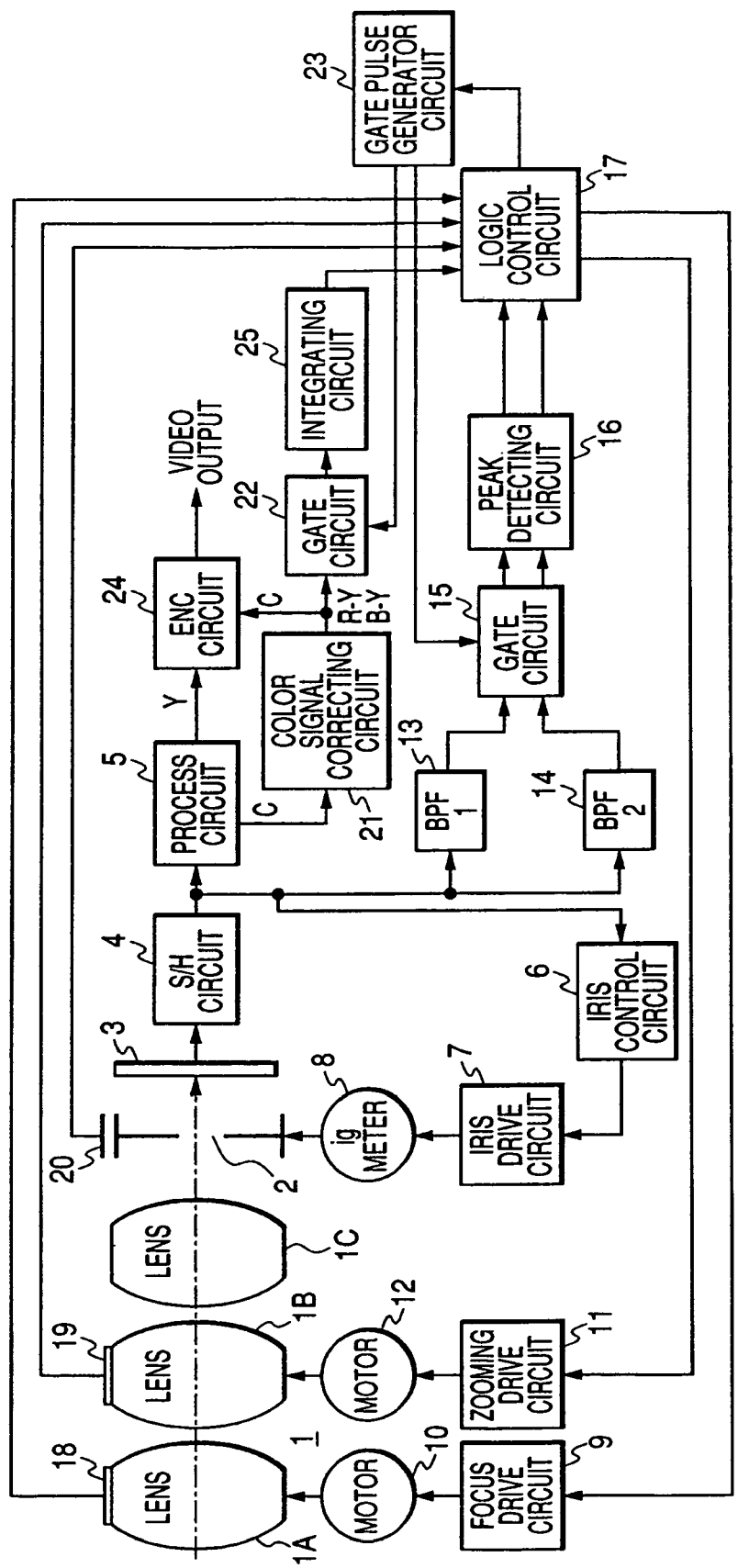
FIG. 15 is a block diagram showing a structure of a still video camera in a fifth embodiment of the present invention.

FIG. 15 is a block diagram showing a constitution of a still video camera constituting a fifth embodiment of the present invention. In the following, an example of application of the solid-state image pickup device of the first or second embodiment to a still video camera will be explained with reference to FIG. 15. The solid-state image pickup device of the first or second embodiment corresponds to a solid-state image pickup device 3 therein.

In FIG. 15, an imaging lens 1 includes a focusing lens 1A for focusing, a zoom lens 1B for zooming, and an focusing lens 1C. There are also provided a diaphragm and a shutter 2; an image pickup device 3 for photoelectric conversion of an object image, focused on an image pickup plane, into an electrical captured image signal; and a sample-hold circuit (S/H circuit) 4 for sample-holding of the captured image signal from the image pickup device 3 and executing an amplification, thereby outputting an image signal.

A process circuit 5 executes processes such as a gamma correction, a color separation and a blanking on the image signal from the sample-hold circuit 4 and outputs a luminance signal Y and chrominance signals C. The chrominance signals C outputted from the process circuit 5 are corrected, in a color signal correction circuit 21, in a white balance and a color balance, are outputted as color difference signals R-Y and B-Y.

The luminance signal Y from the process circuit 5 and the color difference signals R-Y, B-Y from the color signal correction circuit 21 are modulated in an encoder circuit (ENC) 24 to provide a standard television signal, which is supplied to an unillustrated video recorder or an electronic view finder for monitoring.

An iris control circuit 6 controls an iris drive circuit 7 based on the image signal supplied from the sample-hold circuit 4 for automatic control or an ig meter to control an aperture of the diaphragm 2 in such a manner that the image signal assumes a predetermined constant level.

Band-pass filters (BPF) 13, 14 having different bands extract, from the image signal outputted by the sample-hold circuit 4, a high-frequency component required for focus detection. Signals from the first band-pass filter (BPF1) 13 and the second band-pass filter (BPF2) 14 are respectively gated by a gate circuit 15 and a focus gate frame signal, then subjected to the detection of a peak value which is held in a peak detection circuit 16 and supplied to a logic control circuit 17. This signal is called a focus voltage, which is used for focusing.

There are also provided a focus encoder 18 for detecting a position of the focusing lens 1A, a zoom encoder 19 for detecting a focal length of the zoom lens 1B, and an iris encoder 20 for detecting an aperture of the diaphragm 2. The detection values of these encoders are supplied to the logic control circuit 17 for system control.

The logic control circuit 17 executes a focusing operation based on a focus detection on the object according to an image signal corresponding to a predetermined focus detection area. More specifically, at first peak value information of the high-frequency components supplied from the band-pass filters 13, 14 is fetched, and control signals for instructing a rotating direction, a rotating speed, and a rotation/stop operation of a focusing motor 10 is supplied to the focusing drive circuit 9 in order to drive the focusing lens 1A to a position where the peak value of the high-frequency component becomes maximum.

A zoom drive circuit 11 rotates a zooming motor 12 under an instruction for a zooming. The rotation of the zooming motor 12 displaces the zooming lens 1B thereby achieving a zooming operation.

As explained in the foregoing, in the first to fifth embodiments, the photoelectric conversion region 101 generates and accumulates a carrier by photoelectric conversion. The carrier accumulating portion 102 is formed by a trench structure, and accumulates the carrier overflowing from the photoelectric conversion region 101 during the carrier generation and accumulation thereof. The transfer MOS transistor Tx-MOS serves as a first transfer portion for transferring the carrier, accumulated in the photoelectric conversion region 101, to the source-follower amplifier SF-MOS. The transfer MOS transistor Ty-MOS serves as a second transfer portion for transferring the carrier, accumulated in the carrier accumulating portion 102, to the source-follower amplifier SF-MOS.

The embodiments explained in the foregoing are mere examples for executing the present invention, and are not to be construed to restrict the technical scope of the present invention. The present invention is thus subject to various modifications and executable in various forms, without departing from the technical concept or the principal features thereof.

This application claims priority from Japanese Patent Application No. 2005-080345 filed on Mar. 18, 2005, which is hereby incorporated by reference herein.

What is claimed is:

1. A producing method for a solid-state image pickup device including pixels each including:
   a photoelectric conversion region for accumulating carriers generated by incident light;
   a carrier accumulating region for accumulating a carrier overflowing from the photoelectric conversion region; and
   a MOS transistor arranged correspondingly to the photoelectric conversion region, the method comprising, for forming the carrier accumulating region:
   a step of forming a first dielectric film on a semiconductor substrate;
   a step of forming a first electroconductive film on the first dielectric film;
   a step of forming a second dielectric film on the first electroconductive film; and
   a step of forming a second electroconductive film on the second dielectric film,
   wherein a gate electrode of the MOS transistor is formed in the same step as the step for forming the first electroconductive film or the step of forming the second electroconductive film.

2. A producing method for a solid-state image pickup device according to claim 1, wherein the same step is the step of forming the first electroconductive film.

3. A producing method for a solid-state image pickup device according to claim 1, wherein the same step is the step of forming the second electroconductive film.

4. A producing method for a solid-state image pickup device according to claim 1, wherein an antireflective film covering an upper part of the photoelectric conversion region for reducing a reflection of an incident light at an interface of the semiconductor substrate is formed in the same step as the step for forming the first electroconductive film or the step of forming the second electroconductive film.

5. A producing method for a solid-state image pickup device according to claim 1, wherein either of the first and second dielectric films is formed by the same step as a step of forming a silicon nitride film constituting a side wall for forming the MOS transistor into an LDD structure.

* * * * *

UNITED STATES PATENT AND TRADEMARK OFFICE
CERTIFICATE OF CORRECTION

| | | |
|---|---|---|
| PATENT NO. | : 7,259,361 B2 | Page 1 of 1 |
| APPLICATION NO. | : 11/368511 | |
| DATED | : August 21, 2007 | |
| INVENTOR(S) | : Shigeru Nishimura | |

It is certified that error appears in the above-identified patent and that said Letters Patent is hereby corrected as shown below:

COLUMN 1

Line 15, "is being" should read --was--; and
    Line 38, "a lateral" should read --A Lateral--.

COLUMN 7

Line 41, "thus" should read --this--.

COLUMN 10

Line 52, "functions" should read --function--.

COLUMN 11

Line 63, "thus" should read --this--.

Signed and Sealed this

Twenty-ninth Day of April, 2008

JON W. DUDAS
*Director of the United States Patent and Trademark Office*